(12) United States Patent
Strike et al.

(10) Patent No.: US 7,309,968 B2
(45) Date of Patent: Dec. 18, 2007

(54) MOTOR CONTROL CIRCUIT AND ASSOCIATED FULL BRIDGE SWITCHING ARRANGEMENT

(75) Inventors: Nigel D. Strike, Andover (GB); Henry Riddoch, Renfewshire (GB)

(73) Assignee: Minebea Co. Ltd. (JP)

( * ) Notice: Subject to any disclaimer, the term of this patent is extended or adjusted under 35 U.S.C. 154(b) by 419 days.

(21) Appl. No.: 10/490,967

(22) PCT Filed: Oct. 3, 2002

(86) PCT No.: PCT/GB02/04469

§ 371 (c)(1),
(2), (4) Date: Aug. 16, 2004

(87) PCT Pub. No.: WO03/032474

PCT Pub. Date: Apr. 17, 2003

(65) Prior Publication Data

US 2004/0264226 A1    Dec. 30, 2004

(30) Foreign Application Priority Data

Oct. 5, 2001    (GB) .................................. 0123986.2

(51) Int. Cl.
*H01R 39/46*    (2006.01)
(52) U.S. Cl. .......................... 318/439; 318/254; 363/39
(58) Field of Classification Search ................ 318/254, 318/138, 439, 701, 685, 696, 370, 757, 762, 318/758; 363/132, 131, 34, 37, 39, 56–58
See application file for complete search history.

(56) References Cited

U.S. PATENT DOCUMENTS 5,598,093 A * 1/1997 Acatrinei ..................... 323/299
5,825,597 A * 10/1998 Young ......................... 361/31

OTHER PUBLICATIONS

Biswas S K et al: "Gate drive methods for IGBTs in bridge configurations" Industry Applications Society Annual Meeting, 1994., Conference Record of the 1994 IEEE Denver, CO, USA Oct. 2-6, 1994, New York, NY, USA,IEEE, Oct. 2, 1994, pp. 1310-1316, XP010124238 ISBN: 0-7803-1993-I.*

* cited by examiner

*Primary Examiner*—Rajnikant B. Patel
(74) *Attorney, Agent, or Firm*—Hancock Hughey LLP

(57) ABSTRACT

A motor control circuit for controlling a motor, the circuit comprising a switched mode power supply operable to drive a full bridge switching transistor arrangement and to provide a stable voltage to the motor control circuit, wherein the switching transistor arrangement is connectable to the windings of the motor to be controlled, and wherein the switching transistor arrangement comprises: a first set of transistors in an upper part of the full bridge and a second set of transistors in a lower part of the full bridge, the first set of transistors being driven by a first output of the switched mode power supply and the second set of transistors being driven by a second output of the switched mode power supply.

3 Claims, 2 Drawing Sheets

MOTOR CONTROL CIRCUIT AND ASSOCIATED FULL BRIDGE SWITCHING ARRANGEMENT

FIELD OF THE INVENTION

This invention relates to a motor control circuit and particularly to a motor control circuit for a brushless DC motor control circuit.

BACKGROUND AND DESCRIPTION OF RELATED ART

FIG. 1 of the accompanying drawings is a schematic circuit diagram of a conventional DC brushless motor control circuit for use in applications such as air moving fans requiring relatively low power, low voltage DC.

In the motor control circuit of FIG. 1, a supply voltage is fed to a top rail, for example between 18 to 32 volts DC or 36 to 60 volts DC depending on the motor requirements. The motor windings 1 are connected to a full bridge circuit consisting of four n-type FETs 2a,2b,2c,2d driven by a pair of charge pump circuits (IR2104) 3a,3b. The charge pump circuits each receive a direct feed from a DC motor controller IC 4 such as a INT 100 and are each connected to the top rail voltage supply by a respective capacitor 5a,5b. The outputs H1, H2, L1, L2 of the controller IC 4 are connected to the bridge.

A voltage regulator 6 comprising a linear DC-DC converter supplies the controller IC 4 with 12 to 15 volts DC. However, a voltage higher than the top rail must be provided to turn on the two FETs 2a, 2b in the top half of the full bridge, hence the need for the charge pump circuits for the FETs in the top half of the full bridge. The drains of the FETs in the bottom half of the bridge are connected to a resistor 7 to provide an output for sensing the current being drawn by the motor windings 1. The resistor 7 is connected to the current sense input of the IC4.

The n-type FETs can be replaced with p-type FETs but these are expensive, not readily available and less efficient than n-type FETs.

There are problems associated with the circuit of FIG. 1 and other conventional motor control circuits which utilise charge pump circuits for driving the FETs 2a,2b and a linear DC-DC regulator to provide a stable voltage to the control circuit. Charge pump circuits require bulky, expensive components and are not very efficient at transferring energy. In a motor control application the linear DC-DC regulator circuit has to generate a stable voltage over a wide input voltage range. Adherence to this requirement results in a design which is inefficient at high supply voltage levels. Effectively, the voltage regulator must be over-specified to drive the charge pump circuits, thereby causing the voltage regulator to generate too much energy which requires dissipation. It is always inconvenient to dissipate heat from the confines of an enclosure housing a motor and its associated control circuitry, let alone having to dissipate heat from an over-specified voltage regulator.

SUMMARY OF THE INVENTION

It is an object of the present invention to seek to overcome the above-mentioned difficulties and provide a motor control circuit which does not require the use of charge pump circuits.

Accordingly, one aspect of the present invention provides a motor control circuit for controlling a motor, the circuit comprising a switched mode power supply operable to drive a full bridge switching transistor arrangement and to provide a stable voltage to the motor control circuit, wherein the switching transistor arrangement is connectable to the windings of the motor to be controlled, and wherein the switching transistor arrangement comprises: a first set of transistors in an upper part of the full bridge and a second set of transistors in a lower part of the full bridge, the first set of transistors being driven by a first output of the switched mode power supply and the second set of transistors being driven by a second output of the switched mode power supply.

Preferably, the full bridge switching transistor arrangement comprises a full bridge of FETs.

Preferably, one of the switched mode power supply outputs is tied to a power supply rail having a predetermined voltage such that the effective voltage output is the sum of the switched mode power supply voltage output and the predetermined voltage.

Advantageously, each of the switched mode power supply outputs is tied to a power supply rail having a respective predetermined voltage such that the effective voltage output of the respective output is the sum of the respective switched mode power supply voltage output and the respective predetermined voltage.

Conveniently, the switching transistor arrangement comprises a first set of transistors in an upper part of the full bridge and a second set of transistors in a lower part of the full bridge, the first set of transistors being connected to the first output of the switched mode power supply via an array of switching transistors and voltage dividers.

BRIEF DESCRIPTION OF THE DRAWINGS

In order that the present invention can be more readily understood, embodiments thereof will now be described, by way of example, with reference to the accompanying drawings, in which.

DETAILED DESCRIPTION OF THE INVENTION

Figure 1:
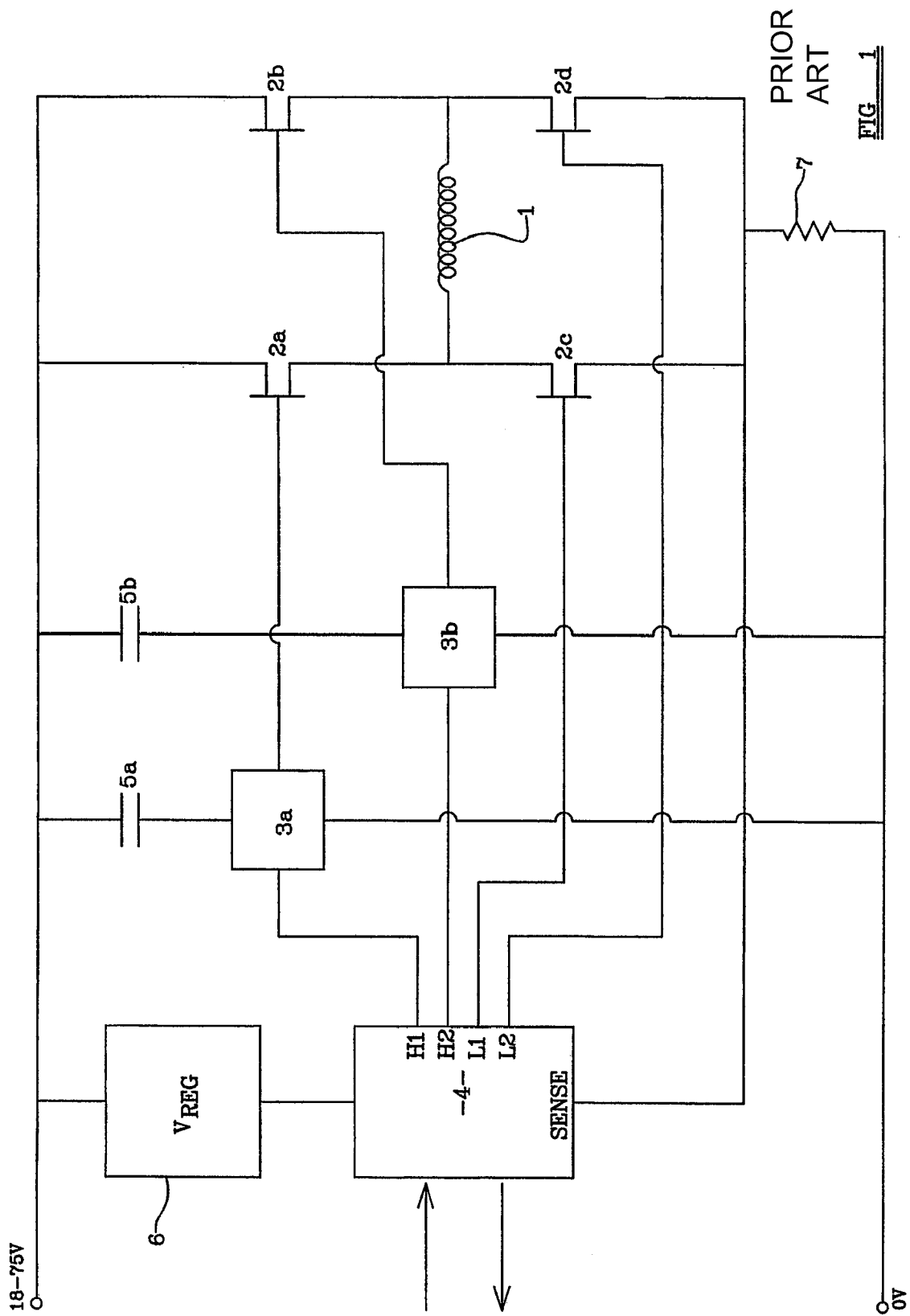
FIG. 1 is a schematic circuit diagram of a conventional motor control circuit.

The present invention dispenses with the problematic charge pump circuits 3a,3b used in conventional motor control circuits and as shown in the conventional motor control circuit of FIG. 1. A motor control circuit embodying the present invention is shown in FIG. 2, like components being accorded the same reference numerals as used in FIG. 1.

Figure 2:
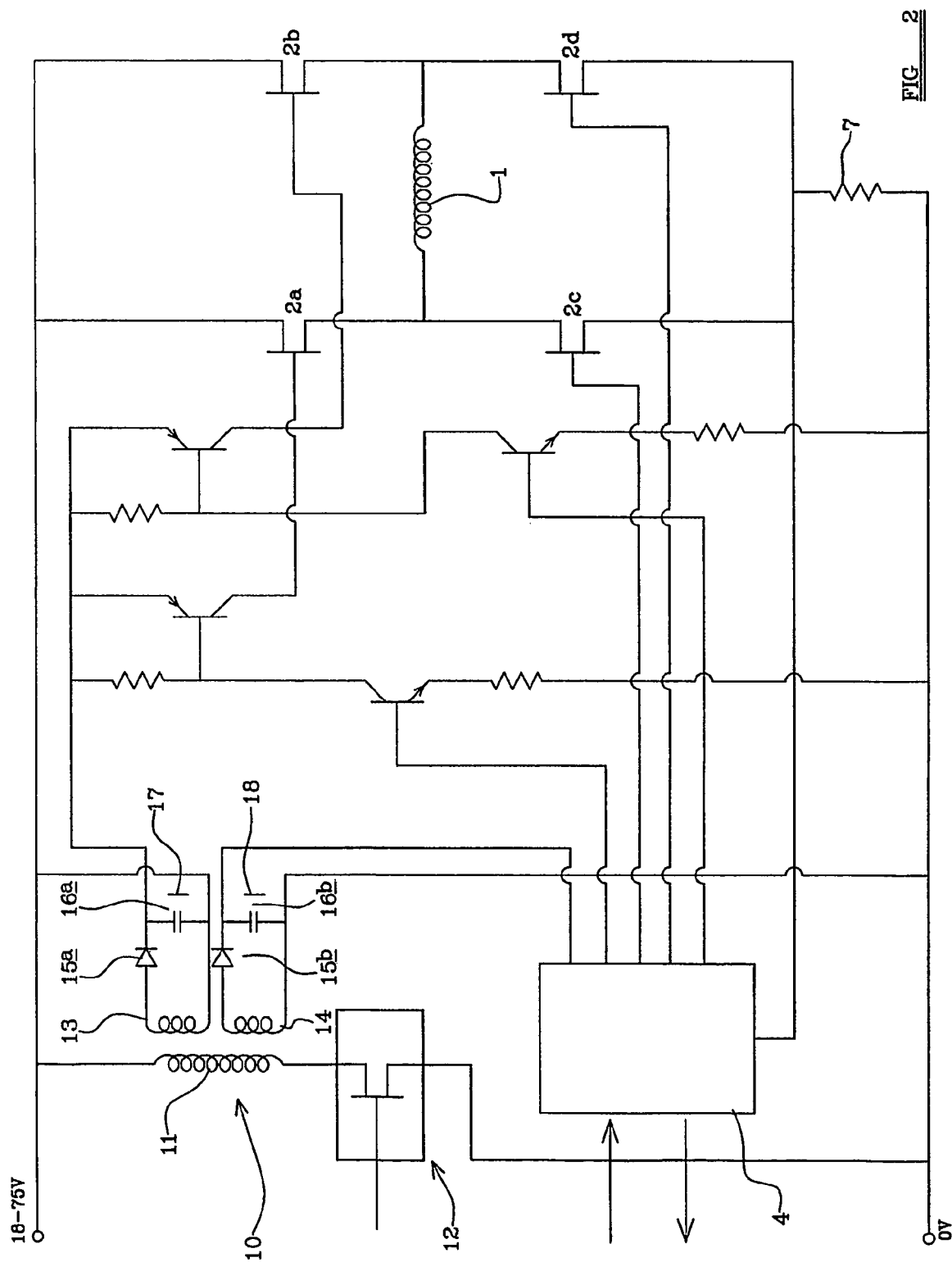
FIG. 2 is a schematic circuit diagram of a motor control circuit embodying the present invention.

Referring to FIG. 2, the charge pump circuits are replaced by a switched mode power supply 10. Switched mode power supplies (switching regulators) are known in the art and are advantageous since they can accommodate a large range of input voltages and operate at a relatively high efficiency. In the past this approach has not been adopted for use in motor drive circuits particularly with motors using integral electronics because of the expense and the relative bulk of the components necessary. It has not been appreciated that a switched mode power supply could be considered or be useful in a motor control circuit for driving the FETs 2a,2b and providing a stable voltage to the control circuit. Indeed, switched mode power supplies are not used in motor control circuits. It has certainly not been appreciated that a switched mode power supply could be used as a means of circumventing the use of a combination of a voltage regulator and charge pump circuits in a motor control circuit. Certainly, switch power mode supplies are typically used only in higher power AC mains applications.

The switched mode power supply transformer 10 comprises a primary winding 11 connected across the top and bottom supply voltage rails in series with a switching transistor 12 to provide an incoming AC power supply. The primary winding is inductively coupled to two secondary windings 13,14 each of which is provided with a forward-biased diode bridge 15a,15b and a bulk capacitor 16a,16b connected in parallel with the loads (i.e. the FETs 2a,2b, to be driven by the upper winding through diode 15a and a stable control circuit voltage to be provided by the lower winding through diode 15b). The respective voltages across the bulk capacitors 16a,16b comprise the power supply outputs 17,18.

Specifically, the switched mode power supply outputs 17,18 are isolated, one of the outputs 17 being tied to the top supply voltage rail so that the output thereof is a predetermined voltage above the top rail voltage. The other output 18 is tied to the bottom rail (0 volts) so as to be a predetermined voltage above that. In this example, the predetermined voltage is 12 volts above the top and bottom rail voltages. The top rail voltage can be selected to be anywhere between 18 to 75. volts DC and can fluctuate between these limits depending on the motor requirements.

The connections to the FETs 2c,2d in the lower half of the full bridge remain unchanged over the example shown in FIG. 1, whereas the connections to the FETs 2a,2b in the upper half of the full bridge are now made to the upper output 17 of the switched mode power supply 10 via an array of switching transistors and voltage dividers in a conventional level shift circuit such that the FETs 2a,2b are appropriately driven to control the motor windings 1. Similarly, the other output 18 of the switched mode power supply 10 generates a stable control circuit voltage and drives the FETs 2c,2d in the lower half of the full bridge through the controller IC 4.

In the present specification "comprise" means "includes or consists of" and "comprising" means "including or consisting of".

The invention claimed is:

1. A motor control circuit for controlling a brushless DC motor, the circuit comprising a lower DC power supply rail and an upper DC power supply rail having a predetermined voltage relative to said lower DC power supply rail,
   a full bridge switching transistors arrangement connected between the upper and lower DC power supply rails, said switching transistors being n-type FETs,
   and wherein the switching transistors arrangement comprises:
      a first set of n-type FETs in an upper part of the full bridge and a second set of n-type FETs in a lower part of the full bridge,
   the motor control circuit further comprising a DC motor controller and a switched mode power supply which comprises;
      a transformer with a primary winding connected in series with a switching transistor, between said upper and lower DC power supply rails and a first secondary winding driving a first output and tied to the upper DC power supply rail such that the effective voltage at said first output is the sum of the voltage due to said first secondary winding and the predetermined voltage,
   the first set of FETs being driven by driver circuitry supplied by said first output of the switched mode power supply and controlled by the DC motor controller,
   said transformer further comprising a second secondary winding driving a second output providing a stable voltage to the DC motor controller.

2. A circuit according to claim 1, wherein the second secondary winding is tied to said lower DC power supply rail such that the effective voltage output of the second output is the sum of the voltage due to said secondary winding and the voltage at said lower DC power supply rail.

3. A circuit according to claim 1, wherein said driver circuitry driving said first set of n-type FETs comprises an array of switching transistors and voltage dividers.

* * * * *